June 23, 1970 A. METZLER 3,517,218
FREQUENCY CONTROL CIRCUIT
Filed Sept. 29, 1966
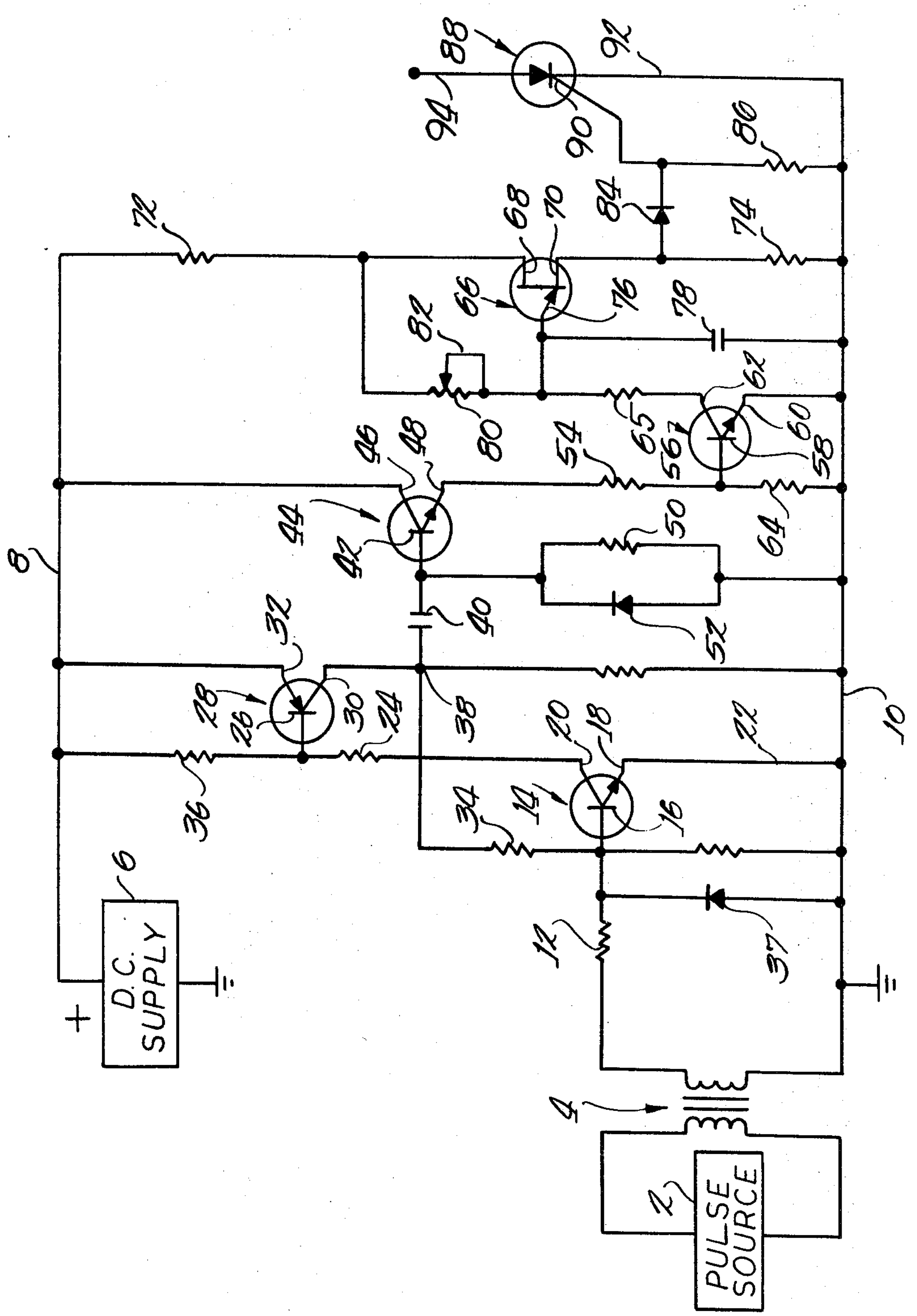
Inventor
Albert Metzler
Atty

3,517,218
FREQUENCY CONTROL CIRCUIT

Albert Metzler, Palos Verdes Peninsula, Calif., assignor to Guardian Electric Manufacturing Company of California, Inc.

Filed Sept. 29, 1966, Ser. No. 583,017
Int. Cl. H03k *1/16, 1/14*
U.S. Cl. 307—265 2 Claims

ABSTRACT OF THE DISCLOSURE

A frequency control circuit comprising positive-feedback coupled transistors for converting a periodic input signal of any waveshape into a rectangular wave form, signal differentiating means, transistor switching means and an oscillator for generating a signal when the switching means is non-conductive for a time duration greater than a pre-selected duration related to the frequency of the input signal pulse to be controlled over a wide audio frequency and signal voltage range.

It is well-known in the art to provide an audio frequency detection or filter circuit using conventional L-C, R-L or R-C networks. The difficulty with such tuned circuits is that the critical frequency is fixed by the circuit components and can be rendered flexible only by the substitution of other components. Moreover, such substitution generally affects parameters of the circuit other than the one which is desired to be changed.

Accordingly, an object of the present invention is to provide a control circuit which will produce an output signal only when the frequency of the input is at a pre-selected value or within a specific frequency band.

Another object of the present invention is to provide a control circuit of the above-stated type wherein the pre-selected control value will be relatively unaffected through a wide range of input signal voltages and in which the pre-selected control frequency may be set in a wide audio frequency range.

The invention will be better understood from the following description in connection with the accompanying drawing in which the single figure shows a circuit diagram of one embodiment of the invention.

Referring now to this figure there is shown an embodiment comprising a GO–NO GO signal indicator and a pulse source 2 coupled through a transformer 4 to the circuit powered by a direct current potential 6 through a supply conductor 8 which is positive with respect to a grounded reference conductor 10. Transformer 4 is coupled through resistor 12 to a transistor, generally designated by reference numeral 14, having a base 16, an emitter 18 and a collector 20. A conductor 22 connects emitter 18 to ground conductor 10. Collector 20 is connected through resistor 24 to the base 26 of a transistor, designated by the reference numeral 28, including a collector 30 and emitter 32. Emitter 32 is connected to supply conductor 8 and collector 30 is connected through resistor 34 to the base 16 of transistor 14 to increase base current of transistor 14. A resistor 36 connects base 26 of transistor 28 to supply conductor 8. A diode 37 clamps the base 16 of transistor 14 to ground conductor 10 to prevent excessive reverse bias during the negative-going portion of the signal as more fully explained hereinafter.

Collector 30 is coupled to a capacitor 40 which is connected to the base 42 of a transistor generally indicated by the reference numeral 44 and including a collector 46 and emitter 48. Base 42 is coupled to ground conductor 10 through resistor 50 and diode 52 connected in parallel. Collector 46 is connected to supply conductor 8 and emitter 48 is connected through resistor 54 to a transistor generally designated by reference numeral 56 comprising base 58, emitter 60 and collector 62. Base 58 is connected to ground conductor 10 through resistor 64. Collector 62 is connected through resistor 65 to a pulse relaxation oscillator circuit.

Pulse relaxation circuit comprises unijunction transistor 66 having double base electrodes 68 and 70 coupled to supply conductor 8 and ground conductor 10 through suitable resistors 72 and 74, respectively, to provide the proper potential. Control element 76 of unijunction transistor 66 is coupled through capacitor 78 to ground conductor 10. A potentiometer resistance winding 80 having a wiper 82 is connected between control element 76 of transistor 66 and base conductor 68 of transistor 66. The wiper may be adjusted, as is well-known in the art, to short a particular portion of the resistance winding. The output of transistor 66 is coupled through diode 84 and resistor 86 to a silicon-controlled rectifier 88 having a gate 90, cathode 92 and anode 94 forming the output terminal.

The operation of the control circuit may best be explained by first assuming that a positive-going pulse is applied from pulse source 2. Conduction of transistor 14 produces current in collector 20 coupled through resistance 24 to bace 26 of transistor 28. Collector 30 of transistor 28 is coupled to base 16 of the first transistor to provide positive feedback through resistor 34. The effect is similar to a Schmitt trigger since the bias at base 16 from the input signal is immediately augmented by transistor 28 collector current providing complete saturation of transistor 14 and an extremely fast rising square wave signal at junction 38. Conduction terminates abruptly when the input signal becomes negative-going and the potential at junction 38 drops to zero. Transistor 14 is protected from excessive reverse bias by diode 37.

The capacitor 40 differentiates the square wave signal and couples the output to the base of emitter-follower 44. The negative-going differentiated pulse peaks are trimmed by diode 52. The output wave form of emitter-follower 44 across resistor 54 is the same as the input wave form and the resistor is coupled to transistor 56 which will conduct during the positive-going portion of the input signal, i.e. a few microseconds. Emitter-follower 44 provides a suitable increase in output current to drive transistor 56.

The output signal of transistor 56 is fed to the pulse relaxation oscillator circuit including the unijunction transistor 66 which has the characteristic high conduction threshold. The oscillator circuit functions so that if transistor 56 is turned off the capacitor 78 is charged through variable resistance 82 from supply source 6. The rate of charging of capacitor 78 is dependent upon the resistance of resistor 82, given a supply source, which may be varied in accordance with the pre-selected frequency which is desired to be sensed. The capacitor 78 and resistor 80, therefore, define a particular charging time. When the charge potential overcomes the threshold of transistor 66 it conducts and the base current is partially supplied by emitter 76 current so as to discharge capacitor 78. Since the unijunction transistor is characterized by a high conduction threshold but thereafter maintains base current at a reduced potential, the discharge of capacitor 78 is extremely quick. The termination of conduction of transistor 66 is abrupt when the capacitor 78 has discharged below a certain potential. The base current output may be fed to gate 90 of silicon-controlled rectifier 88 which provides the GO–NO GO signal.

The capacitor 78 of the relaxation circuit, however, is immediately and rapidly discharged when transistor 56 conducts the sharp pulse. Consequently, if the time duration between the differentiated pulses is even slightly less than the time required to charge capacitor 78 to the threshold of transistor 66, i.e. the oscillator circuit charging time, transistor 66 will not apply a pulse to SCR 88. Since the time duration between differentiated pulses will increase as frequency decreases, any preselected frequency may be accurately sensed by changing the charging time through variable resistance 80.

It will be appreciated that the output of unijunction transistor 66 may be used for a variety of purposes and the silicon-controlled rectifier is simply exemplary.

While there has been shown and described the fundamental novel features of this invention as applied to the particular embodiments thereof, it will be understood that various omissions and substitutions and changes in the form and details of the device illustrated and in its operation may be made by those skilled in the art without departing from the spirit of the invention. It is the intention therefore to be limited only by the scope of the following claims and reasonable equivalents thereof.

I claim:

1. A frequency control circuit responsive to a signal source comprising:

(a) a first circuit having first and second transistors coupled together, said first transistor being provided with an input circuit and said second transistor being provided with an output circuit and coupled to said first transistor to provide positive feedback to said input circuit of said first transistor;

(b) means for applying said source signal to said first transistor input circuit;

(c) a differentiator including an input and an output circuit;

(d) means coupling said first circuit second transistor output circuit to said differentiators input circuit;

(e) an emitter-follower transistor circuit including an input circuit and output circuit;

(f) means coupling said differentiator output circuit to said input circuit of said emitter-follower;

(g) a relaxation oscillator comprising a unijunction transistor having a control element, said unijunction transistor being conductive in the presence of a predetermined potential at said control element and being non-conductive in the absence of said predetermined potential; a charging circuit including a capacitor, a source of potential, and a variable resistance coupled to said unijunction transistor control element; a switching transistor having an input circuit and an output circuit coupled to said charging circuit; said charging circuit creating said predetermined potential at said control element after a preselected frequency related time through said variable resistance when said switching transistor is non-conducting for a time greater than said preselected time, said charging circuit capacitor being discharged when said switching transistor is rendered conductive in less than said predetermined time;

(h) means coupling said emitter-follower output circuit to said switching transistor input circuit;

(l) a silicon-controlled rectifier coupled to said unijunction transistor for providing an output signal only in response to said input signals of said predetermined frequency; and (j) means for adjusting said variable impedance to vary the preselected time for charging said capacitor to said predetermined potential.

2. A frequency control circuit responsive to a signal source comprising in combination:

(a) input means;

(b) means coupled to said input means to provide a rectangular pulse of a time duration equal to the time duration of the input signal pulse including first and second transistors coupled together, said first transistor being provided with an input circuit and said second transistor being provided with an output circuit and being coupled to said first transistor to provide positive feedback to said input circuit of said first transistor and means coupling said first transistor input circuit to said input means;

(c) means differentiating said rectangular pulse coupled to said second transistor output circuit;

(d) an emitter-follower transistor circuit including an output circuit and means coupling said input circuit to said differentiating means;

(e) switching means;

(f) oscillator means for generating a signal only when said switching means in non-conductive for a time duration greater than a preselcted time duration required for said oscillator means to generate a signal, including a unijunction transistor having a control element and being conductive in the presence of a predetermined potential at said control element and being non-conductive in the absence of said predetermined potential, a charging circuit including a capacitor, a source of potential and a variable impedance, means coupling said charging circuit to switching unijucntion transistor control element, said swtching means having an input circuit coupled to said emitter-follower output circuit and an output circuit coupled to said charging circuit, and said charging circuit creating a predetermined potential at said unijunction transistor control element after a preselected time duration when said switching means is non-conducting for a time greater than said preselected charging time and being discharged before creating said predetermined potential when said switching means is conducting; and (g) output means coupled to said oscillating means.

References Cited

UNITED STATES PATENTS

| | | | |
|---|---|---|---|
| 3,184,606 | 5/1965 | Ovenden et al. | 307—265 X |
| 2,985,828 | 5/1961 | Mason | 328—109 |
| 3,036,225 | 5/1962 | Kladde | 307—301 |
| 3,235,750 | 2/1966 | Anderson et al. | 307—288 |
| 3,299,288 | 1/1967 | McDowell et al. | 307—293 |
| 3,315,246 | 4/1967 | Huffman et al. | 328—120 |

JOHN S. HEYMAN, Primary Examiner

B. P. DAVIS, Assistant Examiner

U.S. Cl. X.R.

307—234, 271, 293, 295